US010885956B2

(12) United States Patent
Liu

(10) Patent No.: US 10,885,956 B2
(45) Date of Patent: Jan. 5, 2021

(54) DYNAMIC RANDOM ACCESS MEMORY ARRAY, SEMICONDUCTOR LAYOUT STRUCTURE AND FABRICATION METHOD THEREOF

(71) Applicant: Changxin Memory Technologies, Inc., Anhui (CN)

(72) Inventor: Chih Cheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 16/878,481

(22) Filed: May 19, 2020

(65) Prior Publication Data
US 2020/0279594 A1 Sep. 3, 2020

Related U.S. Application Data

(63) Continuation of application No. PCT/CN2018/118069, filed on Nov. 29, 2018.

(30) Foreign Application Priority Data

Nov. 29, 2017 (CN) .......................... 2017 1 1227178

(51) Int. Cl.
*G11C 7/12* (2006.01)
*G11C 8/14* (2006.01)
*H01L 27/108* (2006.01)

(52) U.S. Cl.
CPC .................. *G11C 7/12* (2013.01); *G11C 8/14* (2013.01); *H01L 27/1085* (2013.01); *H01L 27/10823* (2013.01); *H01L 27/10885* (2013.01)

(58) Field of Classification Search
None
See application file for complete search history.

(56) References Cited

U.S. PATENT DOCUMENTS

| 7,675,783 B2 | 3/2010 | Park et al. |
| 2007/0296045 A1 | 12/2007 | Tanaka |

(Continued)

FOREIGN PATENT DOCUMENTS

| CN | 101320595 A | 12/2008 |
| CN | 102054526 A | 5/2011 |

(Continued)

OTHER PUBLICATIONS

PCT International Search Report and the Written Opinion dated Feb. 27, 2019, issued in related International Application No. PCT/CN2018/118069 (7 pages).

*Primary Examiner* — J. H. Hur
(74) *Attorney, Agent, or Firm* — Sheppard Mullin Richter & Hampton LLP

(57) ABSTRACT

A semiconductor layout structure for a dynamic random access memory (DRAM) array, comprising an isolation structure and a plurality of active areas situated in a semiconductor substrate, each of the active areas extending along a length-wise central axis. The isolation structure is situated among the active areas. The active areas are arranged in an array and comprise a plurality of first active areas and a plurality of second active areas. The first active areas are arranged along a first length-wise direction of the active areas. The second active areas are arranged along a second length-wise direction of the active areas. The first active areas are parallel and adjacent to the second active areas, and the first and second active areas are alternately distributed in a direction of word-lines. The first active area having a first width smaller than a second width of the second active area.

20 Claims, 15 Drawing Sheets

(56) References Cited

U.S. PATENT DOCUMENTS

2008/0117668 A1* 5/2008 Chang .................... G11C 5/025
    365/163
2011/0108889 A1    5/2011 Xing et al.
2013/0089961 A1* 4/2013 Shin ................. H01L 21/28052
    438/294

FOREIGN PATENT DOCUMENTS

| CN | 107342263 A | 11/2017 |
|---|---|---|
| CN | 107910330 A | 4/2018 |
| CN | 207503976 U | 6/2018 |

* cited by examiner

DYNAMIC RANDOM ACCESS MEMORY ARRAY, SEMICONDUCTOR LAYOUT STRUCTURE AND FABRICATION METHOD THEREOF

CROSS-REFERENCE TO RELATED APPLICATIONS

This application is a continuation application of International Patent Application No. PCT/CN2018/118069, filed on Nov. 29, 2018, which claims priority to China Patent Application No. 201711227178.X, filed with the China Patent Office on Nov. 29, 2017 and entitled "DYNAMIC RANDOM ACCESS MEMORY ARRAY, SEMICONDUCTOR LAYOUT STRUCTURE AND FABRICATION METHOD THEREOF." The above-referenced applications are incorporated herein by reference in their entirety.

TECHNICAL FIELD

The present disclosure relates to the field of semiconductor technology and, in particular, to a dynamic random access memory (DRAM) array, a semiconductor layout structure and a fabrication method thereof.

BACKGROUND

Integrated circuits (ICs) have evolved from integrating dozens of components on a single chip to integrating millions of components. The performance and complexity of ICs have far exceeded the original expectations. To further enhance complexity and circuit density (the number of components that can be accommodated within certain area of a chip), the feature size, also known as the geometry of IC components has been made smaller and smaller. Increasing circuit density not only improves ICs' complexity and performance, but also lowers the price of the ICs. To further shrink the feature size of IC components is challenging because every process involved in IC fabrication has a limit. In other words, if a process is required to perform at a feature size smaller than its limit, then either the process or the component has to be changed. In addition, traditional processes and materials can hardly keep up with the increasingly high demands of IC design.

Dynamic random access memories (DRAMs) are the most common types of system memories. Although performance of DRAMs has been greatly improved, there is still a need for its further improvement. Memory size scale-down is a very challenging task because it is hard to scale down the size of memory cell without compromising the memory capacity per unit area. This issue hinders the development of high-density memories. Accordingly, the structures of memory cell arrays often determine, to a large extent, the size of the memory chip.

Existing DRAMs have many issues that limit their performance, such as high turn-on voltage and large on-resistance.

SUMMARY OF THE DISCLOSURE

The present disclosure provides a dynamic random access memory (DRAM) array, its semiconductor layout structure and a method of fabrication to improvement DRAM fabrication.

The present disclosure also provides a dynamic random access memory (DRAM) array, its semiconductor layout structure and a method of fabrication to improve DRAM performance.

To this end, the present disclosure provides a semiconductor layout structure for a DRAM array, comprising an isolation structure and a plurality of active areas situated in a semiconductor substrate, each of the active areas extending along a length-wise central axis, wherein:

the isolation structure is situated among the plurality of active areas;

the active areas are arranged in an array and comprise a plurality of first active areas and a plurality of second active areas, the plurality of first active areas arranged along a first length-wise direction of the active areas, the plurality of second active areas arranged along a second length-wise direction of the active areas, the plurality of first active areas being parallel and adjacent to the plurality of second active areas, the first and second active areas alternately distributed in a direction of word-lines, the first active areas having a first width smaller than a second width of the second active areas.

In some embodiments, in the layout structure for the DRAM array, second width may be 20%-70% greater than the first width.

In some embodiments, the semiconductor layout structure for the DRAM array may further comprise a plurality of word lines situated in the semiconductor substrate, wherein in each column of the active areas, two of the plurality of word lines intersect and traverse the first and second active areas respectively.

The present disclosure also provides a DRAM array comprising:

a semiconductor substrate, in which an isolation structure defines a plurality of active areas each extending along a length-wise central axis, the active areas arranged in an array and comprising a plurality of first active areas and a plurality of second active areas, the plurality of first active areas arranged along a first length-wise direction of the active areas, the plurality of second active areas arranged along a second length-wise direction of the second active areas, the plurality of first active areas being parallel and adjacent to the plurality of second active areas, the first and second active areas alternately distributed in a direction of word-lines, the first active areas having a first width smaller than a second width of the second active areas; and a plurality of bit lines comprising first bit lines and second bit lines, formed on the active areas of the semiconductor substrate, wherein in the direction of word-lines, a projection of each of the first bit lines in a height-wise direction intersects corresponding ones of the first active areas, and a projection of each of the second bit lines in the height-wise direction intersects corresponding ones of the second active areas.

In some embodiments, in the DRAM array, the second width may be 20%-70% greater than the first width.

In some embodiments, the DRAM array may further comprise a plurality of word lines formed in the semiconductor substrate, wherein in the direction of word-lines, two of the plurality of word lines intersect and traverse the first and second active areas respectively.

In some embodiments, the DRAM array may further comprise a plurality of contact terminals formed on the active areas of the semiconductor substrate and distributed on opposing sides of the bit lines.

In some embodiments, the DRAM array may further comprise a plurality of capacitors each disposed on one of the contact terminals.

In some embodiments, in the DRAM array, adjacent active areas in adjacent columns may be collinearly arranged along a length-wise direction of the active areas, wherein the active areas that are collinearly arranged on a same line have a same width, while the active areas that are arranged on adjacent lines have different widths, such that a projection of each of the bit lines in the height-wise direction goes through a center of a corresponding one of the active areas and the each bit line has a linear shape.

The present disclosure also provides a method for fabrication a DRAM array, comprising:

providing a semiconductor substrate;

forming, in the semiconductor substrate, an isolation structure which defines a plurality of active areas extending along a length-wise central axis, the active areas arranged in an array and comprising a plurality of first active areas and a plurality of second active areas, the plurality of first active areas arranged along a first length-wise direction of the first active areas, the plurality of second active areas arranged along a second length-wise direction of the second active areas, the plurality of first active areas being parallel and adjacent to the plurality of second active areas, the first and second active areas alternately distributed in a direction of word-lines, the first active areas having a first width smaller than a second width of the second active areas; and forming, on the active areas of the semiconductor substrate, a plurality of bit lines comprising first bit lines and second bit lines, wherein in the direction of word-lines, a projection of each of the first bit lines in a height-wise direction intersects corresponding ones of the first active areas, and a projection of each of the second bit lines in the height-wise direction intersects corresponding ones of the second active areas.

In some embodiments, in the method, the formation of the isolation structure defining the plurality of active areas in the semiconductor substrate may comprise:

forming, on the semiconductor substrate, a first dielectric layer having a plurality of protrusions, wherein a projection of each of the protrusions of the first dielectric layer on the semiconductor substrate is rectangular.

In some embodiments, in the method, the formation of the isolation structure defining the plurality of active areas in the semiconductor substrate may comprise: forming a second dielectric layer on the first dielectric layer, wherein a portion of the second dielectric layer covers at least side walls of the protrusions along a profile of the protrusions of the first dielectric layer.

In some embodiments, in the method, the formation of the isolation structure defining the plurality of active areas in the semiconductor substrate may comprise: using an etchant to etch the second dielectric layer in a direction deviating from a height-wise direction of the protrusions and leaning toward one side of the protrusions so that the first dielectric layer is partially exposed, wherein opposing side walls of each of the protrusions are still covered by remaining portions of the second dielectric layer, and wherein the remaining portion of the second dielectric layer on one of the opposing side walls has a different width from that of the other remaining portion of the second dielectric layer on the other one of the opposing side walls.

In some embodiments, in the method, the formation of the isolation structure defining the plurality of active areas in the semiconductor substrate may comprise: forming isolation trenches in the semiconductor substrate by successively etching the first dielectric layer and the semiconductor substrate with the remaining portions of the second dielectric layer serving as an etching mask and by stopping the etching within the semiconductor substrate, wherein the isolation trenches define a plurality of active area mesas arranged in an array in the semiconductor substrate, each column of the active area mesas comprising first active area mesas having a first width and second active area mesas having a second width, the first active area mesas and the second active area mesas alternately distributed.

In some embodiments, in the method, the formation of the isolation structure defining the plurality of active areas in the semiconductor substrate may comprise: removing a remaining portion of the first dielectric layer and the remaining portions of the second dielectric layer.

In some embodiments, in the method, the formation of the isolation structure defining the plurality of active areas in the semiconductor substrate may comprise: forming the isolation structure by filling an isolation material in the isolation trenches formed in the semiconductor substrate; and forming the first active areas having the first width and the second active areas having the second width by doping the active area mesas.

In some embodiments, in the method, the second width may be 20%-70% greater than the first width.

In some embodiments, in the method, the direction for etching may be inclined at an angle of 10°-40° with respect to a normal of a top surface of the semiconductor substrate.

In some embodiments, the method may further comprise, subsequent to the formation of the plurality of bit lines: forming a plurality of contact terminals on the active areas in the semiconductor substrate, the plurality of contact terminals distributed on the opposing sides of the bit lines.

In some embodiments, the method may further comprise, subsequent to the formation of the plurality of bit lines: forming a plurality of capacitors each located on one of the plurality of contact terminals.

In the DRAM array, the semiconductor layout structure and the method of the present disclosure, the active areas are arranged in such an array that adjacent active areas in each single column have different widths and that a direction of the columns intersects a direction in which the active areas extend. As a result, fabrication difficulty is reduced, a basis is provided for subsequent module fabrication, and the high turn-on voltage and high on-resistance problems are relieved.

Further, capacitors formed on the basis of the above have different capacitances due to different charge storage capacities of the active areas with different widths. As a result, multiple levels of storage ability are achieved, thus improving device performance.

Figure 1:
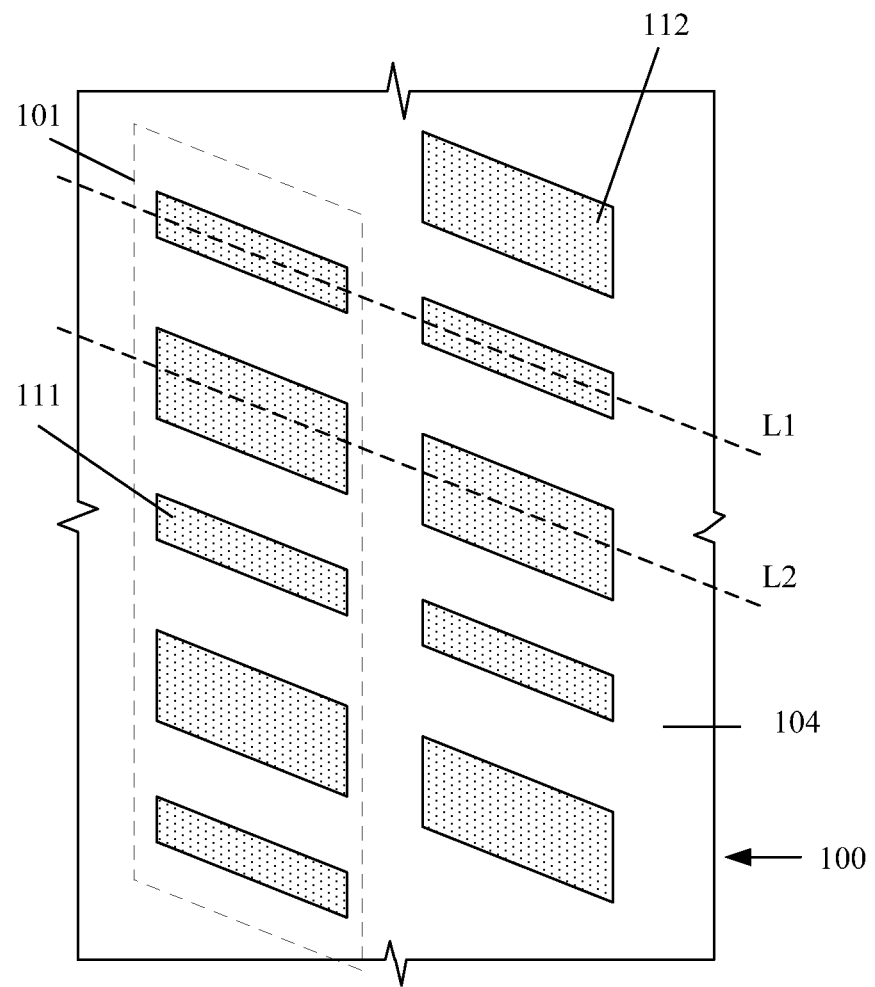
FIG. 1 schematically illustrates a semiconductor layout structure for a DRAM array according to some embodiments of the present disclosure.

A list of Reference Numerals in the Drawings is provided below.

| | |
|---|---|
| 100 | semiconductor substrate |
| 111, 112 | active area |
| 101 | column area |
| 104 | isolation structure |
| 1101 | contact-terminal region |
| 1102 | bit-line contact region |
| 140 | bit line |
| 121, 121' | first dielectric layer |
| 122 | second dielectric layer |
| 1221, 1222 | remaining portions of second dielectric layer |
| 123 | plasma etching |
| 180 | contact terminal |
| 130 | word line |
| 131 | first conductive layer |
| 132 | third dielectric layer |
| 140 | bit line |
| 140a | insulating layer |
| 141 | work function layer |
| 142 | second conductive layer |
| 143 | fourth dielectric layer |
| 150 | protective layer |
| 160 | first isolation layer |
| 170 | contact window |
| 180 | contact terminal |
| 200 | second isolation layer |
| 210 | opening for capacitor |
| 220 | capacitor |

DETAILED DESCRIPTION

Dynamic random access memory (DRAM) arrays, semiconductor layout structure therefor and fabrication methods thereof according to the present disclosure will be described in greater detail below with reference to the accompanying drawings which provide preferred embodiments of the present disclosure. Those skilled in the art can make changes to the embodiments disclosed herein while still obtaining the beneficial results thereof. Therefore, the following description shall be construed in accordance with what is widely known by those skilled in the art, and should not be construed as limiting the scope of the present disclosure.

In the following description, when any layer (or film), region, pattern or structure is described as being "on," "over," (or overlying) a substrate, another layer (or film), another region, a welding pad and/or another pattern, the layer, region, pattern or structure may be disposed directly on the substrate, the other layer (or film), the other region, the welding pad and/or the other pattern, or alternatively with one or more other layers inserted therebetween. In addition, any layer described as being "under" (or underlying) another layer may be disposed directly under the other layer, or alternatively with one or more yet other layers inserted therebetween. Reference to the overlying and underlying layers may be made in the appended figures.

A DRAM array includes a semiconductor substrate, active areas, bit lines and contact terminals. However, with the device size's continuing to shrink, the consistency of the critical dimension among the active areas becomes one of the key factors that affect DRAM performance, including the turn-on voltage (VT) and the on-resistance (RON).

Referring to FIG. 1, a semiconductor layout structure for a DRAM array is illustrated according to some embodiments of the present disclosure. As shown, the active areas 111, 112 in each column area 101 are alternately arranged with different widths, rather than with the same width, and these active areas with different widths have different charge storage capabilities. This arrangement not only ameliorates the above problems but also significantly improves the DRAM performance.

Also referring to FIG. 1, the layout structure for the DRAM array includes:

an isolation structure 104 and a plurality of active areas 111, 112, all arranged in a semiconductor substrate 100. The active areas 111, 112 respectively extend along length-wise central axes L1, L2.

The isolation structure 104 is situated among the plurality of active areas 111, 112.

The plurality of active areas 111, 112 are arranged in an array and comprise a plurality of first active areas 111 and a plurality of second active areas 112. The plurality of first active areas 111 are arranged along a first length-wise direction L1 of the active areas, and the plurality of second active areas 112 are arranged along a second length-wise direction L2 of the active areas. Moreover, the first active areas 111 are parallel and adjacent to the plurality of second active areas 112. Further, the first active areas 111 and the second active areas 112 are alternately distributed in a direction of word-lines. For example, the first active areas 111 and the second active areas 112 are alternately arranged in each single column area 101 along the direction of word-lines. The word-lines will be described in detail below with reference to FIGS. 10 and 11. Furthermore, the first active areas 111 have a first width smaller than a second width of the second active areas 112.

In some embodiments, in each column area 101, there are a plurality of the active areas 111, 112 including some of the first active areas 111 having the first width and some of the second active areas 112 having the second width that are alternately distributed. For example, the second width is 20%-70% greater than the first width.

In some embodiments, adjacent active areas 111, 112 in adjacent columns are collinearly arranged along a length-wise direction of the active areas 111, 112 (e.g., the first length-wise direction L1, or the second length-wise direction L2), and the all active areas 111, 112 that are collinearly arranged on the same line have the same width. For example, as shown in FIG. 1, the first active areas 111 in adjacent columns are collinearly arranged on the same line along the direction L1, while the second active areas 112 in adjacent columns are collinearly arranged on the same line along the direction L2. This can facilitate the formation of bit lines (as described below) above equally wide active areas 111, 112.

In some embodiments, active areas 111, 112 in adjacent column areas 101 extend in the same direction (i.e., parallel to one another). Each of the active areas 111, 112 may have an elongated shape. Active areas 111, 112 in each column area 101 extend in the same direction (i.e., parallel to one another). Due to process limitation, there may be some variations among the active areas 111, 112. Such variations in the fabrication process will not lead to departure from the core principles of the present disclosure. In another words, it is sufficient that the active areas 111, 112 are substantially parallel to one another.

The layout may further include a plurality of word lines 130 (shown in FIG. 10) situated in the semiconductor substrate. Two word lines intersect and traverse the first and second active areas 111, 112 respectively in each column areas 101.

Further, in each column area 101, the active areas 111, 112 may be distributed at a constant pitch. That is, in each column area 101, the active areas 111, 112 extend parallel to one another at a constant pitch so that a uniform distribution of them is achieved.

As shown in the above description in connection with the layout, the active areas 111, 112 do not have a constant width. Instead, they have different widths. In particular, adjacent active areas 111, 112 in each column have different widths. This avoids the difficulty of fabricating active areas with uniform widths.

In addition, the active areas with different width in the layout make it easier to fabricate the device and overcome a number of other issues. For example, the wider active areas can decrease the contact terminals' contact resistance, and therefore reduce the on-resistance. For example, due to different charge storage capabilities of the active areas with different width, the capacitors formed have different capacitances, which can result in a significant improvement in device performance. These advantages will be described in detail below.

A DRAM array and a method for fabricating the DRAM array will be described in greater detail below with reference to FIGS. 2-15. A better understanding of the DRAM array layout of the present disclosure can be obtained from the schematic top and schematic cross-sectional views among the FIGS. 2-15. To facilitate a better understanding of the subject matter of the following embodiments, some layers or films are omitted from the drawings of top views. In comparison, the drawings of the cross-sectional views may be more comprehensive.

Figure 2:
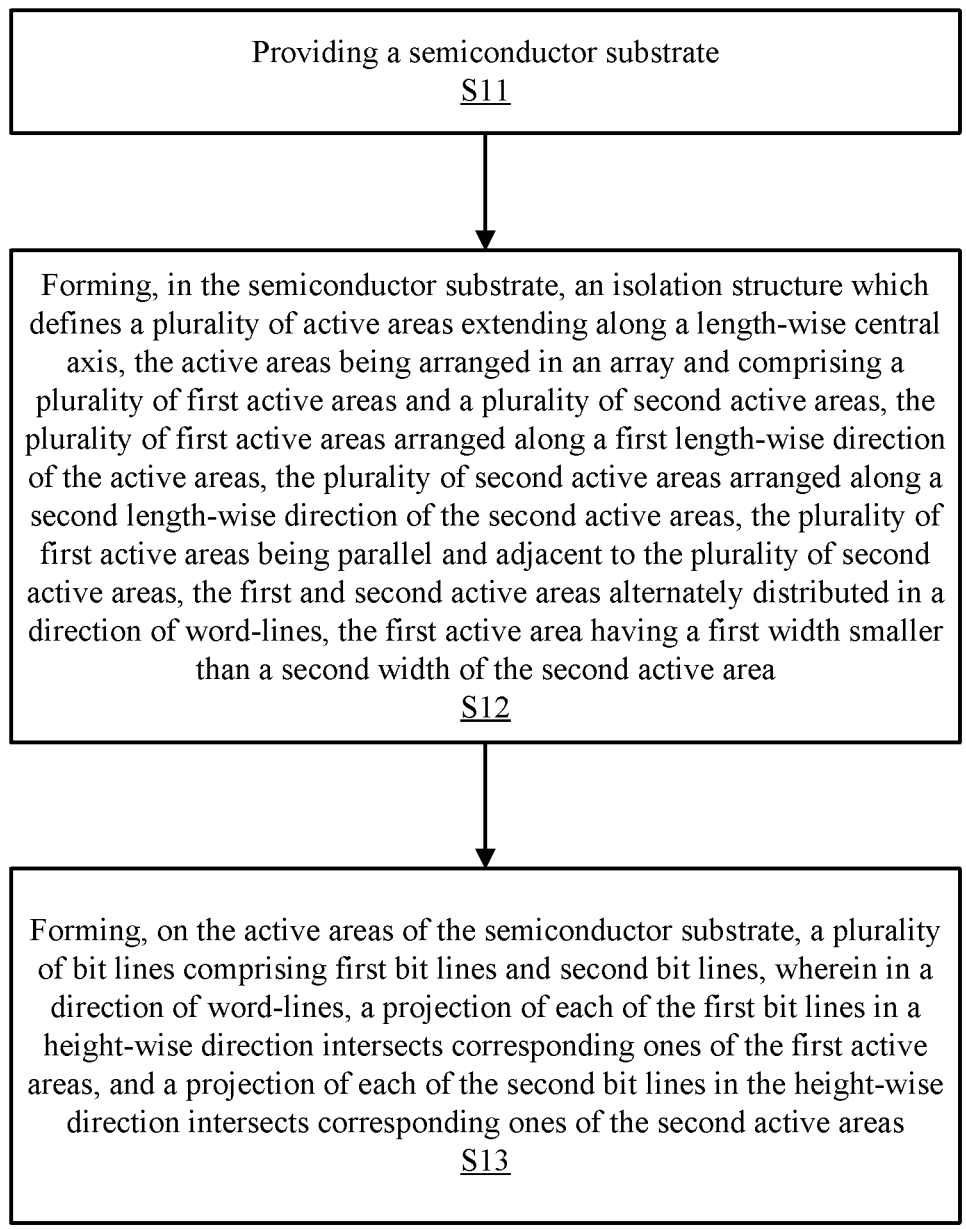
FIG. 2 is a schematic flowchart of a method for fabricating a DRAM array according to some embodiments of the present disclosure.

Referring to FIG. 2, the present disclosure also provides a method 200 for fabricating a DRAM array. As shown in FIG. 2, the method 200 includes the steps of:

S11: providing a semiconductor substrate;

S12: forming, in the semiconductor substrate, an isolation structure which define a plurality of active areas extending along a length-wise central axis, the active areas being arranged in an array and comprising a plurality of first active areas and a plurality of second active areas, the plurality of first active areas extending arranged along a first length-wise direction of the active areas, the plurality of second active areas arranged along a second length-wise direction of the second active areas, the first active areas being parallel and adjacent to the second active areas, the first and second active areas alternately distributed in a direction of word-lines, the first active area having a first width that is smaller than a second width of the second active area;

S13: forming a plurality of bit lines on the active areas in the semiconductor substrate, the plurality of bit lines comprising first bit lines and second bit lines, wherein in a direction of word-lines, a projection of each of the first bit lines in a height-wise direction intersects corresponding ones of the first active areas, and a projection of each of the second bit lines in the height-wise direction intersects corresponding ones of the second active areas.

Figure 3:
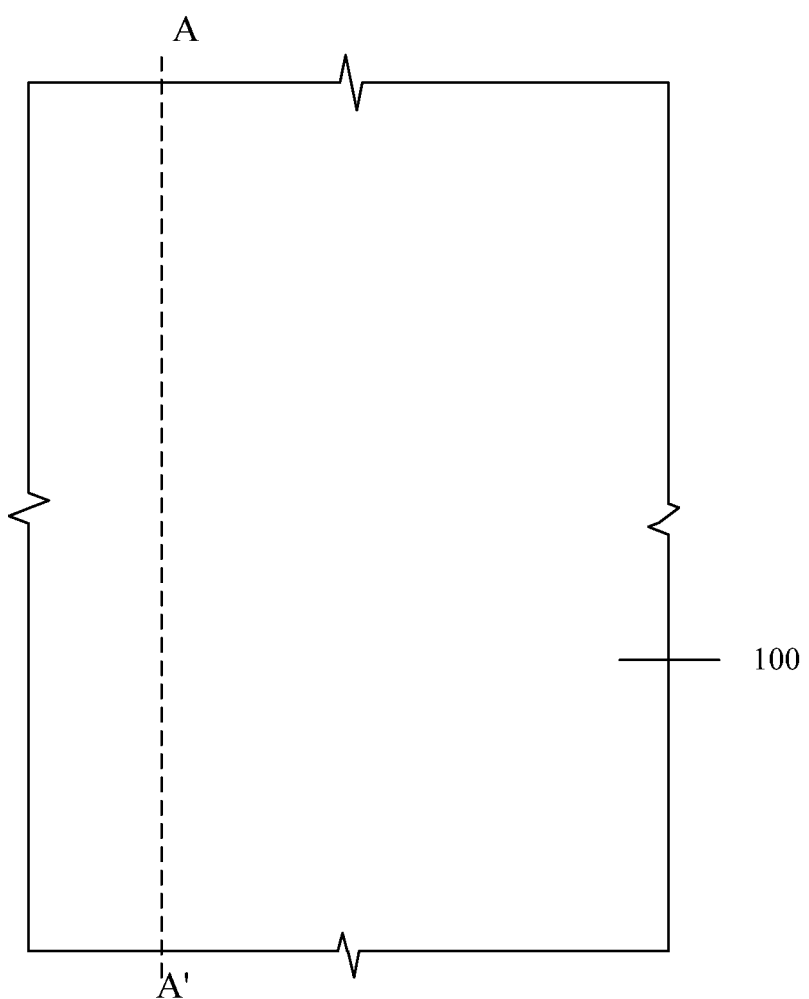
FIG. 3 is a schematic top view of a semiconductor substrate provided in a method for fabricating a DRAM array according to some embodiments of the present disclosure.
Figure 4:
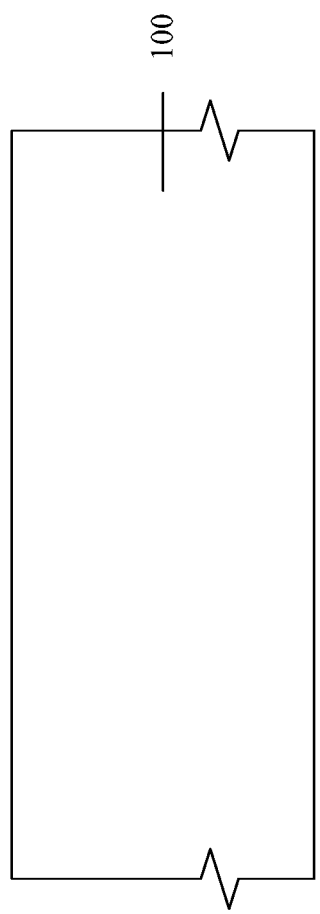
FIG. 4 is a schematic cross-sectional view taken along A-A in FIG. 3 according to some embodiments of the present disclosure.

Referring to FIG. 3, a schematic top view of a semiconductor substrate provided in a method for fabricating a DRAM array is illustrated according to some embodiments of the present disclosure. In step S11 of the method 200, a semiconductor substrate 100 is provided. For example, the semiconductor substrate 100 may be a monocrystalline silicon substrate, a polycrystalline silicon substrate, an amorphous silicon substrate, a silicon-germanium (SiGe) substrate, a silicon-on-insulator (SOI) substrate, or a substrate of another material known to those skilled in the art. In the semiconductor substrate 100, there may already be doped regions or other semiconductor structures, without departing from the scope of the present disclosure.

Referring back to FIG. 1, in conjunction with FIGS. 5-9, in step S12 of the method 200, in the semiconductor substrate 100, an isolation structure 104 is formed to define the plurality of active areas 111, 112 extending along length-wise central axes L1, L2. The active areas 111, 112 are arranged in an array and comprise a plurality of first active areas 111 and a plurality of second active areas 112. The plurality of first active areas 111 are arranged along a first length-wise direction L1 of the active areas, while the plurality of second active areas 112 arranged along a second length-wise direction L2 of the second active areas. The first active areas 111 are parallel and adjacent to the second active areas 112. In a direction of word-lines, the first and second active areas are alternately distributed in each of the column area 101. The first active areas 111 have a first width that is smaller than a second width of the second active areas 112.

In some embodiments, the active areas 111, 112 may be obtained as follows. A first dielectric layer 121 including a plurality of protrusions is formed on the semiconductor substrate 100. Projection of each of the protrusions of the first dielectric layer 121 on the semiconductor substrate 100 is rectangular. That is, the protrusions are rectangles. Further, the protrusions are arranged in an array. The array of the protrusions may not be the same as that of the resulting active areas 111, 112. For example, the protrusions may have the same dimensions and be uniformly arranged in an array.

In some embodiments, the first dielectric layer 121 may be selected as silicon nitride, and the protrusions thereof may be obtained by forming the first dielectric layer 121 and etching it.

Next, a second dielectric layer 122 is formed on the first dielectric layer 121. Portions of the second dielectric layer 122 coming in contact with the respective protrusions of the first dielectric layer 121 at least cover side walls of the protrusions along a profile of the protrusions. In some embodiments, the second dielectric layer 122 may cover the entire first dielectric layer 121 and follow the shape thereof. For example, as shown in the FIG. 5, the second dielectric layer 122 may have a serpentine cross-section.

In some embodiments, the second dielectric layer 122 may have a thickness "D" that is smaller than a height of the protrusions and smaller than a pitch between adjacent protrusions. In some embodiments, the second dielectric layer 122 may be selected as silicon oxide, and due to the presence of the protrusions, it is serpentine in shape. The first dielectric layer 121 and the second dielectric layer 122 are not limited to the aforementioned materials and may also be selected as other materials. For example, the second dielectric layer 122 may alternatively be photoresist or the like.

Figure 5:
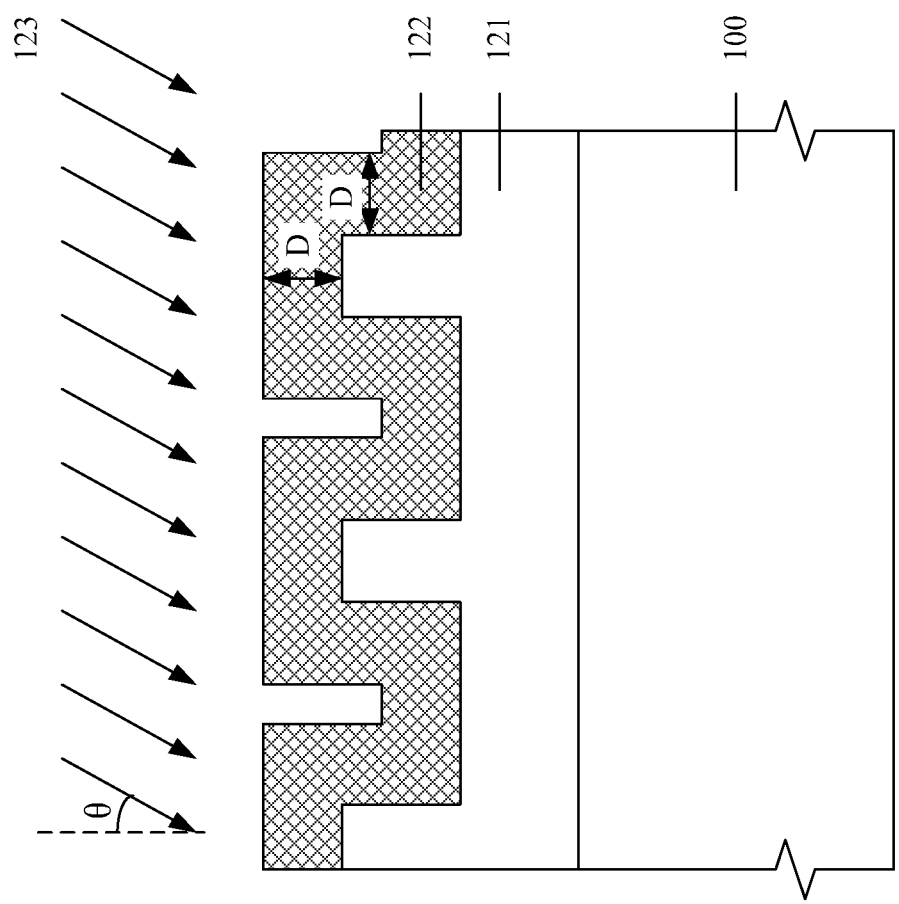
FIG. 5 is a schematic cross-sectional view taken along A-A' in FIG. 3 of a first dielectric layer and a second dielectric layer formed in a method for fabricating a DRAM array according to some embodiments of the present disclosure.
Figure 6:
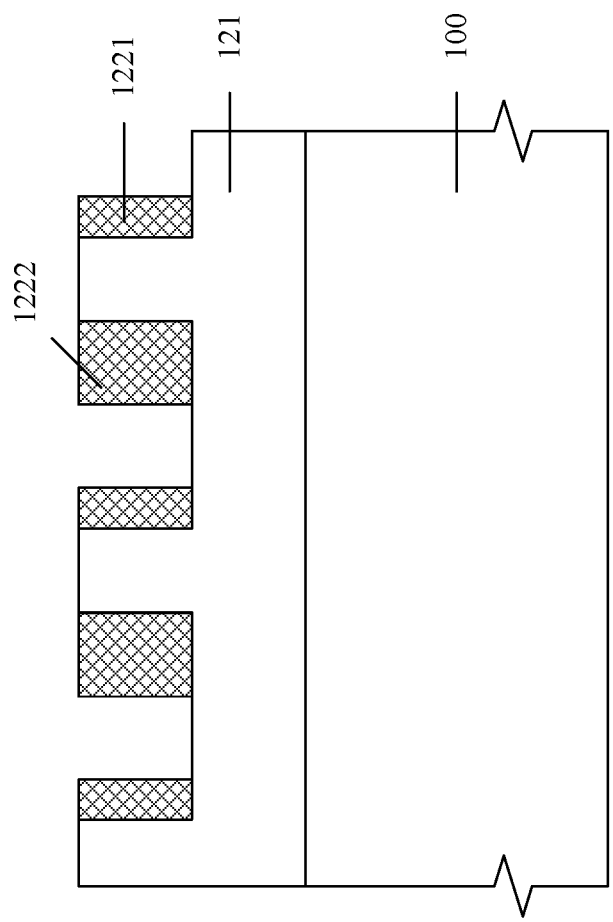
FIG. 6 is a schematic cross-sectional view taken along A-A' in FIG. 3 of a structure resulting from etching a second dielectric layer in a method for fabricating a DRAM array according to some embodiments of the present disclosure.

Referring to FIGS. 5 and 6, a schematic cross-sectional view taken along A-A' in FIG. 3 of a first dielectric layer and a second dielectric layer formed in a method for fabricating a DRAM array is illustrated in FIG. 5, according to some embodiments of the present disclosure. Further, a schematic cross-sectional view taken along A-A' in FIG. 3 of a structure resulting from etching a second dielectric layer in a method for fabricating a DRAM array is illustrated in FIG. 6, according to some embodiments of the present disclosure. As shown in FIGS. 5 and 6, an etchant is used to etch the second dielectric layer 122 in a direction slanted with respect to a height-wise direction of the protrusions and inclined toward one side of the protrusions so that the first dielectric layer 121 is partially exposed. For example, the direction for etching deviates from a height-wise direction of the protrusions and leans toward one side of the protrusions. In addition, opposing side walls of each of the protrusions are still covered by remaining portions 1221, 1222 of the second dielectric layer 122, which have different widths.

In some embodiments, the second dielectric layer 122 may be plasma etched in a first direction so that remaining portions 1221, 1222 of the second dielectric layer 122 may be formed on the opposing side walls of the protrusions respectively, where the remaining portions 1221, 1222 of the second dielectric layer 122 have a first width and a second width respectively. In some embodiments, the first direction may be oriented at an angle of 10°-40° with respect to a normal of a top surface of the substrate.

In some embodiments, the second width may be 20%-70% greater than the first width. The widths may be determined, in particular, based on the practical needs and achieved by adjusting the first direction in which the second dielectric layer 122 is etched.

Figure 7:
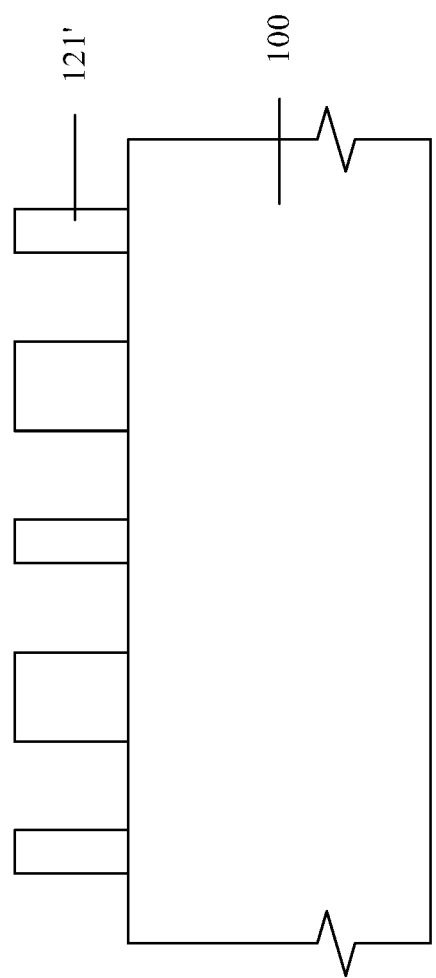
FIG. 7 is a schematic cross-sectional view taken along A-A' in FIG. 3 of a structure resulting from etching a first dielectric layer in a method for fabricating a DRAM array according to some embodiments of the present disclosure.
Figure 8:
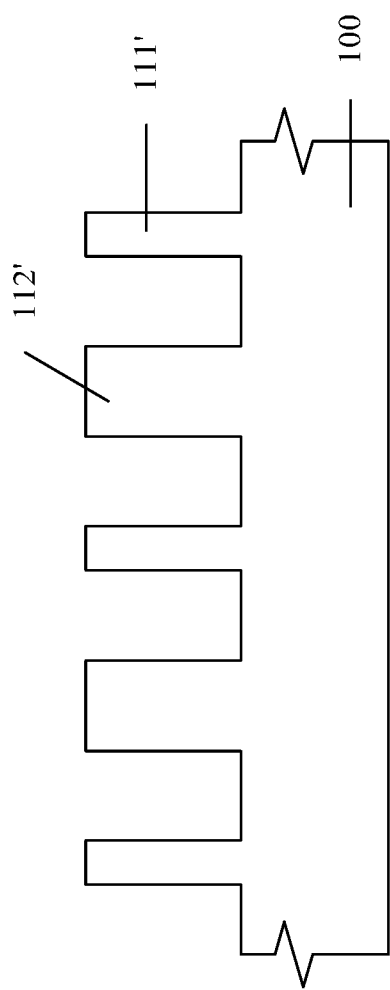
FIG. 8 is a schematic cross-sectional view taken along A-A' in FIG. 3 of a structure resulting from etching a semiconductor substrate in a method for fabricating a DRAM array according to some embodiments of the present disclosure.

Referring to FIGS. 7 and 8, a schematic cross-sectional view taken along A-A' in FIG. 3 of a structure resulting from etching a first dielectric layer in a method for fabricating a DRAM array is illustrated in FIG. 7, according to some embodiments of the present disclosure. Further, a schematic cross-sectional view taken along A-A' in FIG. 3 of a structure resulting from etching a semiconductor substrate in a method for fabricating a DRAM array is illustrated in FIG. 8, according to some embodiments of the present disclosure. As shown in FIGS. 7-8, isolation trenches are formed in the semiconductor substrate 100 by successively etching the first dielectric layer 121 and the semiconductor substrate 100, with the remaining portions 1221, 1222 of the second dielectric layer serving as an etching mask. The etching stops in the semiconductor substrate 100. As a result, the isolation trenches formed in the semiconductor substrate isolate a plurality of active area mesas 111', 112' arranged in an array. The active area mesas 111', 112' in each column include first active area mesas 111' having the first width and second active area mesas 112' having the second width. The first active area mesas 111' and the second active area mesas 112' are alternately distributed.

The remaining portion of the first dielectric layer (i.e., the remaining portions 121' of the first dielectric layer after the etching) and the remaining portions of the second dielectric layer (i.e., the remaining portions 1221, 1222 of the second dielectric layer) are removed. In some embodiments, the removal of the remaining portions of the first and second dielectric layers 121', 1221, 1222 may follow the etching that stops within the semiconductor substrate 100. In some embodiments, as shown in FIG. 7, the remaining portions 1221, 1222 of the second dielectric layer may be removed after they have served as a mask for the etching of the first dielectric layer 121. Subsequently, the etched first dielectric layer 121' may serve as a mask for the etching of the semiconductor substrate 100.

In some embodiments, the etching of the semiconductor substrate 100 proceed to a depth greater than a thickness of the active areas to be formed so as to achieve better isolation of the active areas 111, 112 by the subsequently formed isolation structure.

As shown in FIG. 8, as a result of the above steps, the pattern of the second dielectric layer 122 achieved from the slanted etching, which has different wide portions, is transferred into the semiconductor substrate 100. Thus, the active area mesas 111', 112' having different widths appear in the semiconductor substrate 100 and will be transformed into the desired active areas 111, 112 by ion implantation.

Figure 9:
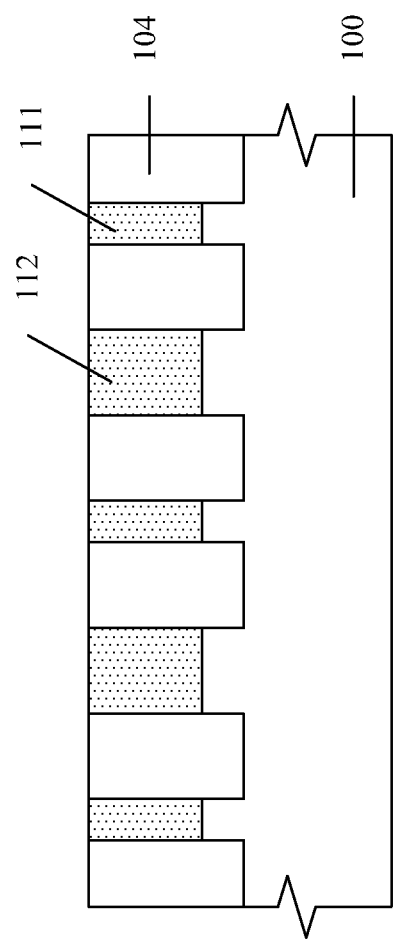
FIG. 9 is a schematic cross-sectional view taken along A-A' in FIG. 3 of formation of an isolation structure in a method for fabricating a DRAM array according to some embodiments of the present disclosure.

Referring to FIG. 9, a schematic cross-sectional view taken along A-A' in FIG. 3 of formation of an isolation structure in a method for fabricating a DRAM array is illustrated according to some embodiments of the present disclosure. As shown in FIG. 9, an isolation material is filled into the isolation trenches in the semiconductor substrate 100 to form the isolation structure 104, following by doping the active area mesas 111', 112' to form the first active areas 111 having the first width and the second active areas 112 having the second width. In some embodiments, the doping may be accomplished through technologies known to those skilled in the art, and by using ions that are of a type and implanted at a dose, determined according to practical needs.

The isolation structure 104 may be, for example, silicon oxide or the like, and may be formed using technologies known to those skilled in the art, and the present disclosure is not limited in this regard.

In some embodiments, the filled isolation material may be planarized to make the isolation structure 104 flush with the semiconductor substrate 100 at their top surfaces.

Insofar, the formation of the active areas 111 having the first width and the active areas 112 having the second width has been completed. The active areas 111, 112 do not have consistent widths, but different widths. In some embodiments, adjacent active areas 111, 112 in the same column 101 have different widths. This avoids the difficulty of fabricating active areas with uniform widths.

Referring back to FIG. 1, a top view of the resulting active areas 111, 112 is illustrated. As shown, the isolation structure is situated among the active areas 111, 112, and the active areas 111, 112 are arranged in an array and include a plurality of first active areas 111 and a plurality of second active areas 112. The first active areas 111 extend longitudinally in a direction L1 and are adjacent to the second active areas 112 that extend longitudinally in a direction L2. Further, the first active areas 111 are distributed alternately with the second active areas 112 in each column area 101 in a direction of word-lines. The first width of the first active areas 111 is smaller than the second width of the second active areas 112.

In some embodiments, in the each column area 101, there are a plurality of the active areas 111, 112 including, alternately distributed, some of the first active areas 111 with the first width and some of the second active areas 112 with the second width that is 20%-70% greater than the first width.

In some embodiments, adjacent active areas 111, 112 in adjacent columns are collinearly arranged along length-wise extension lines of the active areas 111, 112, and all active areas 111, 112 that are collinearly arranged on the same line have the same width. Additionally, active areas 111, 112 that are arranged on adjacent lines have different widths, so that a projection of the bit lines 140 in the height-wise direction goes through a center of a corresponding one of the active areas 111, 112 and the bit lines 140 are linear in shape.

For example, as shown in FIG. 1, the first active areas 111 extend in the same direction L1, while the adjacent second active areas 112 extend in the same direction L2. This makes it easier to form the bit lines above the active areas 111, 112 of the same widths (as detailed below).

In adjacent column areas 101, the active areas 111, 112 extend in the same direction (i.e., parallel to one another). In some embodiments, each of the active areas 111, 112 has an elongated shape. In each column area 101, each of the active areas 111, 112 extends in the same direction (i.e., parallel to one another). In some embodiments, due to process limitation, there may be some variations among the active areas 111, 112. Such variations in the fabrication process will not lead to departure from the core principles of the present disclosure. In another words, it is sufficient that the active areas 111, 112 are substantially parallel to one another.

In addition, in each column area 101, the active areas 111, 112 are distributed at a constant pitch. That is, in each column area 101, the active areas 111, 112 extend parallel to one another at a constant pitch so that a uniform distribution is achieved.

Figure 10:
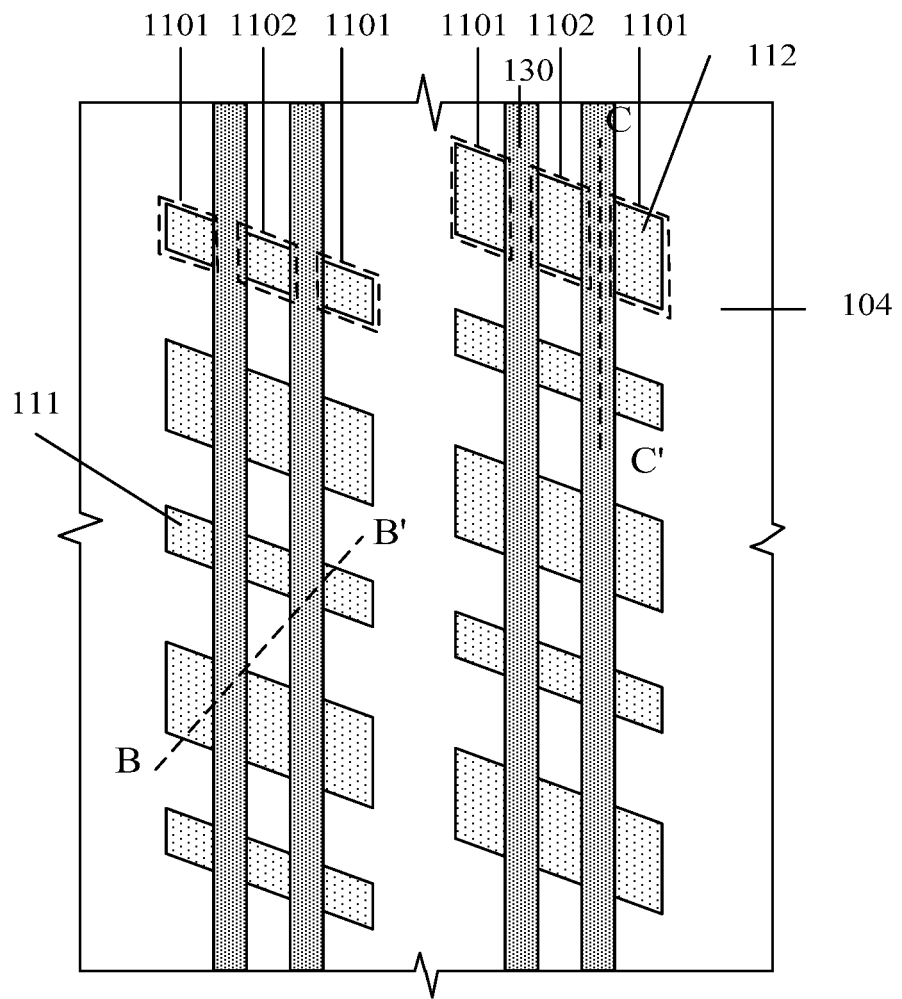
FIG. 10 is a schematic top view of formation of word lines in a method for fabricating a DRAM array according to some embodiments of the present disclosure.
Figure 11:
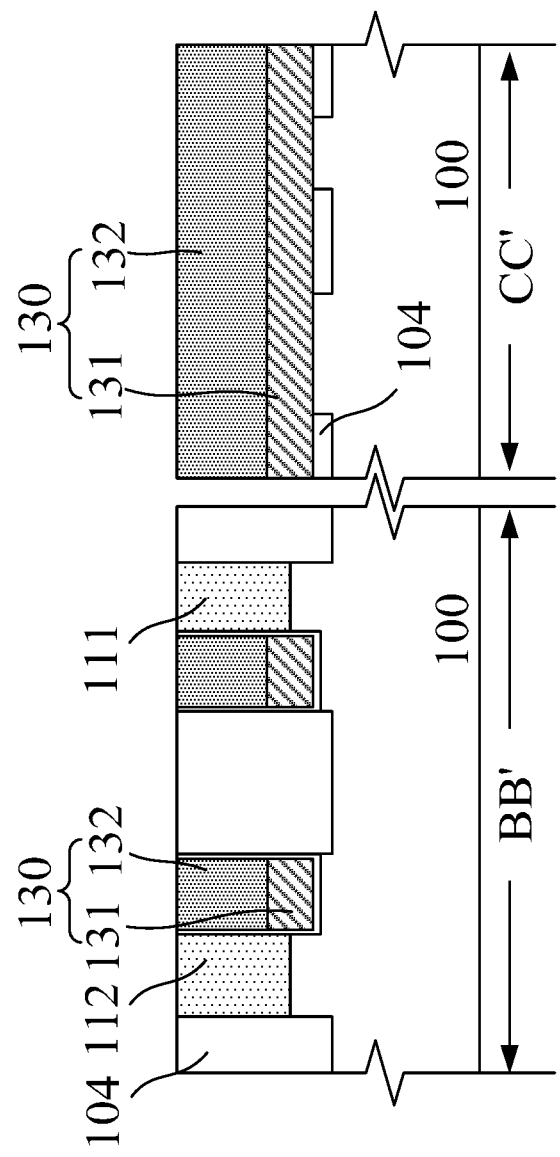
FIG. 11 shows schematic cross-sectional views taken respectively along B-B' and C-C' in FIG. 10 according to some embodiments of the present disclosure.

Referring to FIGS. 10 and 11, a schematic top view of formation of word lines in a method for fabricating a DRAM array is illustrated in FIG. 10 according to some embodiments of the present disclosure. Further, schematic cross-sectional views taken respectively along B-B' and C-C' in FIG. 10 are illustrated in FIG. 11 according to some embodiments of the present disclosure. As shown in FIGS. 10 and 11, the method for fabricating a DRAM array of the present disclosure may further include, subsequent to the formation of the active areas 111, 112:

forming word lines 130.

The active areas 111, 112 may define bit-line contact regions 1102 and contact-terminal regions 1101 located on the two sides of the bit-line contact regions 1102. The word lines 130 may be located between the bit-line contact regions 1102 and the contact-terminal regions 1101.

Photolithography and etching processes may be performed to form, in the semiconductor substrate 100, word-line trenches in which the word lines 130 will be formed.

In some embodiments, each two of the word-line trenches form a pair to traverse a column of active areas 111, 112 so that each of the active areas 111, 112 is trisected. After that, the word lines are formed in the word-line trenches.

In some embodiments, the word lines 130 may intersect the corresponding active areas 111, 112 so as to contact gate structures formed in the active areas 111, 112. In some embodiments, the word lines 130 each extend in the direction of a corresponding column of active areas 111, 112. Accordingly, the gate structures of the active areas 111, 112 in each column area 101 are connected to the same word line 130. In some embodiments, the word lines 130 may be buried word lines. That is, the word lines 130 may be formed within the semiconductor substrate 100.

In some embodiments, the gate structures formed in the active areas 110 may also form part of the word lines 130, and corresponding portions of the isolation structure 104 may also comprises the material of the word lines 130. Additionally, the material of the word line 130 in the isolation structure may be joined to the gate structures to form the word lines 130.

Also as shown in FIG. 11, the word lines 130 may include a first conductive layer 131 and a third dielectric layer 132. Moreover, portions of the first conductive layer 131 within the active areas 111, 112 constitute the gate structures and are connected with respective portions of the first conductive layer 131 within the isolation structure 104. The third dielectric layer 132 covers the first conductive layer 131 so as to prevent its electrical connections with other wires.

As shown in the portion CC' of FIG. 11, the word lines 130 do not extend downwardly beyond the isolation structure 104. Therefore, the isolation structure 104 can provide good isolation.

Figure 12:
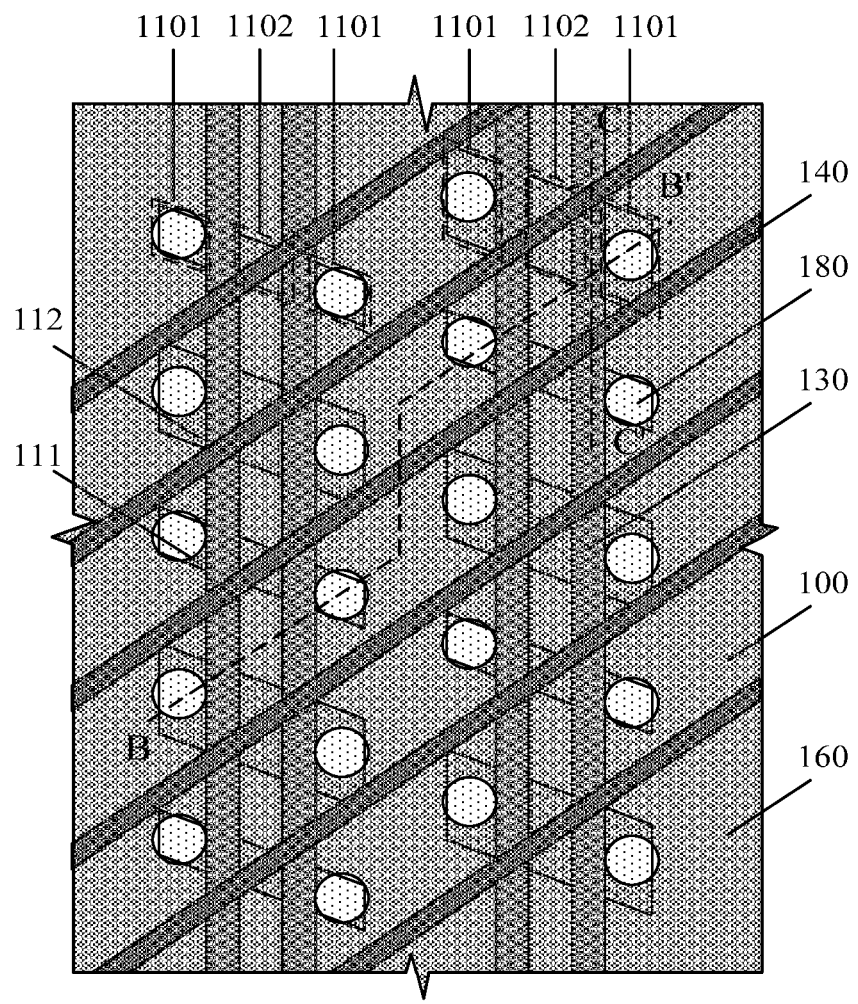
FIG. 12 is a schematic top view of a structure resulting from formation of bit lines and contact terminals in a method for fabricating a DRAM array according to some embodiments of the present disclosure.
Figure 13:
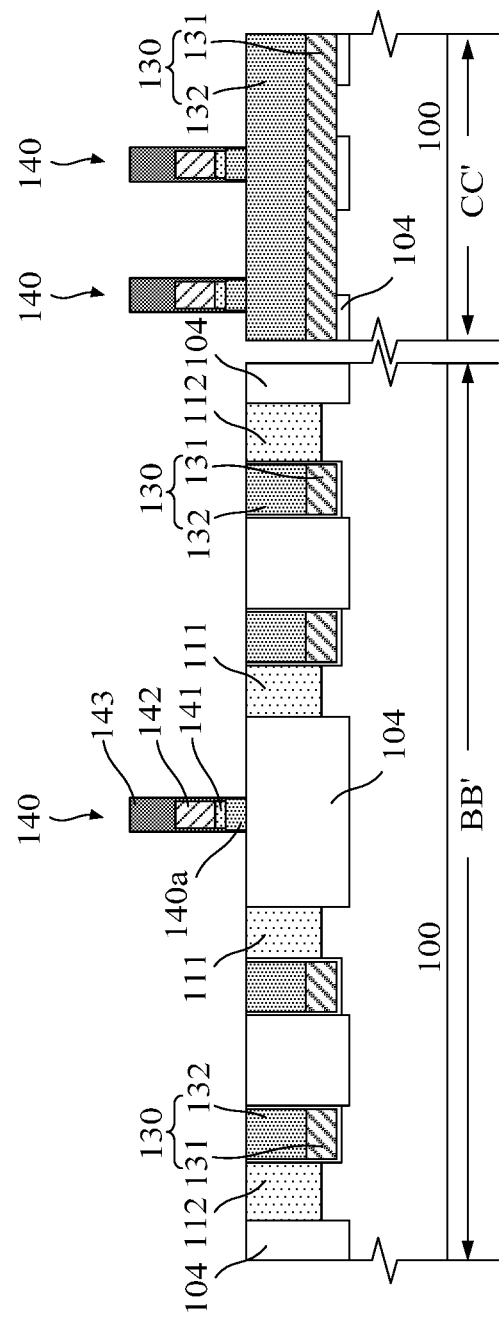
FIG. 13 shows schematic cross-sectional views taken respectively along B-B' and C-C' in FIG. 12 of a structure resulting from formation of bit lines in a method for fabricating a DRAM array according to some embodiments of the present disclosure.

Referring to FIGS. 12 and 13, a schematic top view of a structure resulting from formation of bit lines and contact terminals in a method for fabricating a DRAM array is illustrated in FIG. 12 according to some embodiments of the present disclosure. Further, schematic cross-sectional views taken respectively along B-B' and C-C' in FIG. 12 of a structure resulting from formation of bit lines in a method for fabricating a DRAM array are illustrated in FIG. 13 according to some embodiments of the present disclosure. As shown in FIGS. 12 and 13, the method for fabricating a DRAM array of the present disclosure further includes, subsequent to the formation of the word lines 130:

As S13 of the method 200 in FIG. 2: forming a plurality of bit lines 140 on the active areas 111, 112 in the semiconductor substrate 100, the plurality of bit lines 140 including first bit lines and second bit lines, wherein a projection of each of the first bit lines in the height-wise direction intersects corresponding ones of the first active areas 111, and a projection of each of the second bit lines in the height-wise direction intersects corresponding ones of the second active areas 112. In some embodiments, the bit lines 140 come into contact with the active areas 111, 112 at the bit-line contact regions 1102.

According to some embodiments, each of the bit lines 140 not only functions to transmit information, but also spaces apart the contact-terminal regions 1101 of each active area 111, 112 in each column area on the two sides of the bit line 140 so that the bit line 140 serves as an isolation barrier for preventing the bridging of contact terminals 180 subsequently formed in these contact-terminal regions 1101. In some embodiments, the bit lines 140 may be linear. In some embodiments, a curved or a zigzagged shape of the bit lines 140 may be also possible.

In some embodiments, bit-line contacts (not shown) may be formed on the bit-line contact regions 1102 and serve to connect the bit-line contact regions 1102 to the respective bit lines 140. The bit-line contacts and bit lines 140 may either be formed in the same step or in different steps. In the former case, for example, the materials of the bit lines 140 may be deposited both on bit-line contact regions 1102 and corresponding regions for the bit lines. In the latter case, for example, the bit-line contacts may be first formed on the bit-line contact regions 1102, followed by forming the bit lines 140 and connecting the bit lines 140 to the bit-line contacts. The latter case will be described in greater detail below as an example for explaining the formation of the bit-line contacts and the bit lines according to some embodiments of the present disclosure. For example, the formation of the bit-line contacts and the bit lines may include the steps of:

1) forming an insulating layer 140a on the semiconductor substrate 100, the insulating layer 140a covering the entire semiconductor substrate 100 and being able to prevent electrical connections between regions other than the bit-line contact regions and the subsequently formed bit lines 140;

2) performing a photolithography process to form a first mask layer on the insulating layer 140a, where the portions of the insulating layer 140a on the bit-line contact regions 1102 remain exposed;

3) etching away the exposed portions of the insulating layer 140a so that contact holes are formed through which the bit-line contact regions 1102 are exposed;

4) forming the bit-line contacts by filling the contract holes with material of the bit-line contacts;

5) depositing, on the insulating layer 140a, materials of the bit lines including those for a work function layer 141, a second conductive layer 142 and a fourth dielectric layer 143, i.e., successively depositing the work function layer 141, the second conductive layer 142 and the fourth dielectric layer 143 over the insulating layer 140a;

6) performing a photolithography process to form, on the materials of the bit lines, a second mask layer which defines a pattern of the bit lines to be formed; and 7) forming the bit lines 140 by an etching process. At this point, the bit lines 140 contact the bit-line contacts in the bit-line contact regions and are isolated from the semiconductor substrate 100 in regions other than the bit-line contact regions by the insulating layer 140a.

In some embodiments, subsequent to the formation of the bit lines 140, exposed portions of the insulating layer 140a may be removed, with the remainder thereof underlying the bit lines 140 being retained.

Further, in some embodiments, spacers may be formed on side walls of each of the bit lines 140 so as to protect the bit lines 140 and prevent electrical connections of the bit lines 140 with other layers or films. The formation of the spacers may, for example, include: depositing, on the semiconductor substrate 100, an insulating material layer which covers the exposed surface of the semiconductor substrate 100 as well as tops and side walls of the bit lines 140; and performing an etch-back process to remove at least the portion of the insulating material layer on the surface of the semiconductor substrate, and retain the portions of the insulating material layer on the side walls of the bit lines 140 as the spacers.

As shown in FIG. 13, the formed bit lines 140 are higher than the semiconductor substrate 100, thus providing a plurality of isolation barriers on the surface of the semiconductor substrate 100. The plurality of isolation barriers can be utilized in the subsequent formation of the contact terminals 180 to determine borders of the contact terminals 180 by self-alignment.

Figure 14:
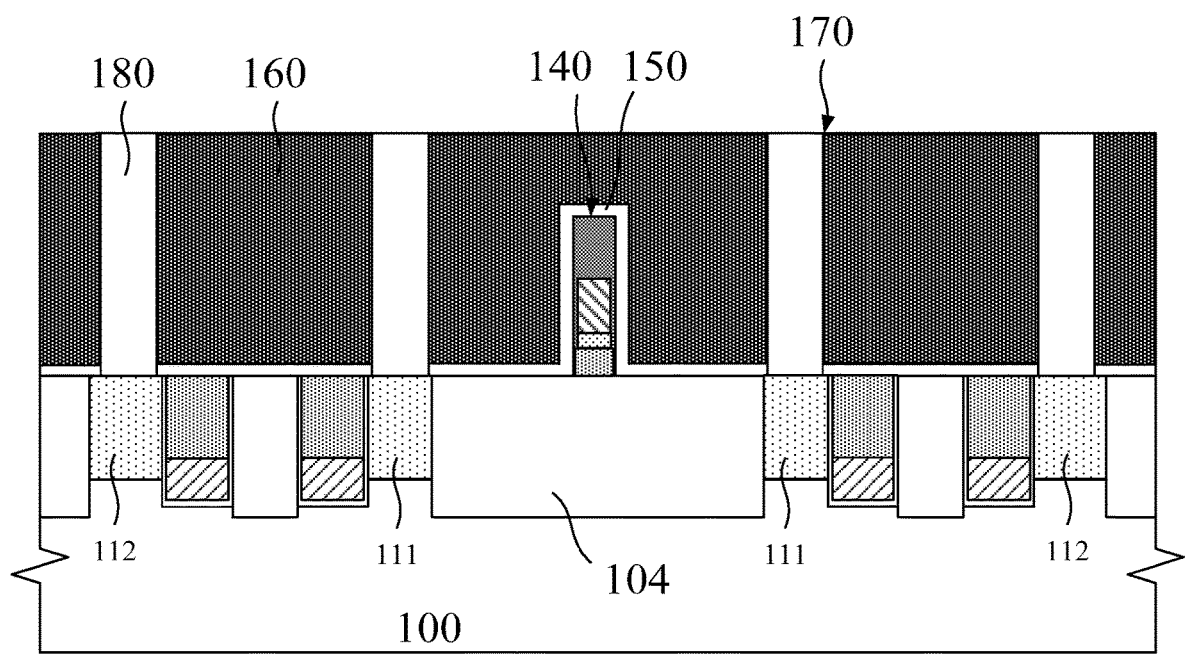
FIG. 14 is a schematic cross-sectional view taken along B-B' in FIG. 12 of a structure resulting from formation of contact terminals in a method for fabricating a DRAM array according to some embodiments of the present disclosure.

Referring to FIG. 14, a schematic cross-sectional view taken along B-B' in FIG. 12 of a structure resulting from formation of contact terminals 180 in a method for fabricating a DRAM array is illustrated according to some embodiments of the present disclosure. As shown in FIG. 14, subsequent to the formation of the bit lines 140, on the substrate 100 may be deposited a protective layer 150. The protective layer 150 covers at least the side walls of the bit lines 140 and can thus protect the bit lines 140 or act as a sacrificial layer to prevent damages of the bit lines 140 in the subsequent process, where the bit lines 140 serve as isolation barriers. In some embodiments, the protective layer 150 may further cover the surface of the semiconductor substrate 100 and the tops of the bit lines 140. Further, the protective layer 150 may be either a single layer or a stack of several layers. For example, the protective layer 150 may be an oxide layer, a nitride layer or a combination thereof.

Still referring to FIGS. 12 and 14, the plurality of contact terminals 180 are formed on the active areas 111, 112 in the semiconductor substrate 100 and located on the opposing sides of the bit lines 140. This step may include:

forming, on the semiconductor substrate 100, a first isolation layer 160 which fill the gaps among the bit lines 140 and protrude beyond the bit lines 140, i.e., covering them.

In some embodiments, the first isolation layer 160 may be an oxide layer, a nitride layer or a combination thereof.

In some embodiments, contact windows 170 may then be formed in the first isolation layer 160. Through the contact windows 170, at least the contact-terminal regions 1101 of the active areas 111, 112 in the same columns are exposed.

Thereafter, the contact windows 170 may be filled with a conductive material layer, which is electrically connective with the contact-terminal regions 1101 of the active areas 111, 112. During the filling, the conductive material layer may be also deposited on the isolation layer 160. The conductive material layer on the isolation layer 160 may be removed by chemical mechanical polishing (CMP) or a similar process. As a result, the contact terminals 180 are formed in the respective contact windows 170. In some embodiments, each of the contact terminals 180 may be a stack of multiple layers, and a further description thereof will be omitted herein.

Figure 15:
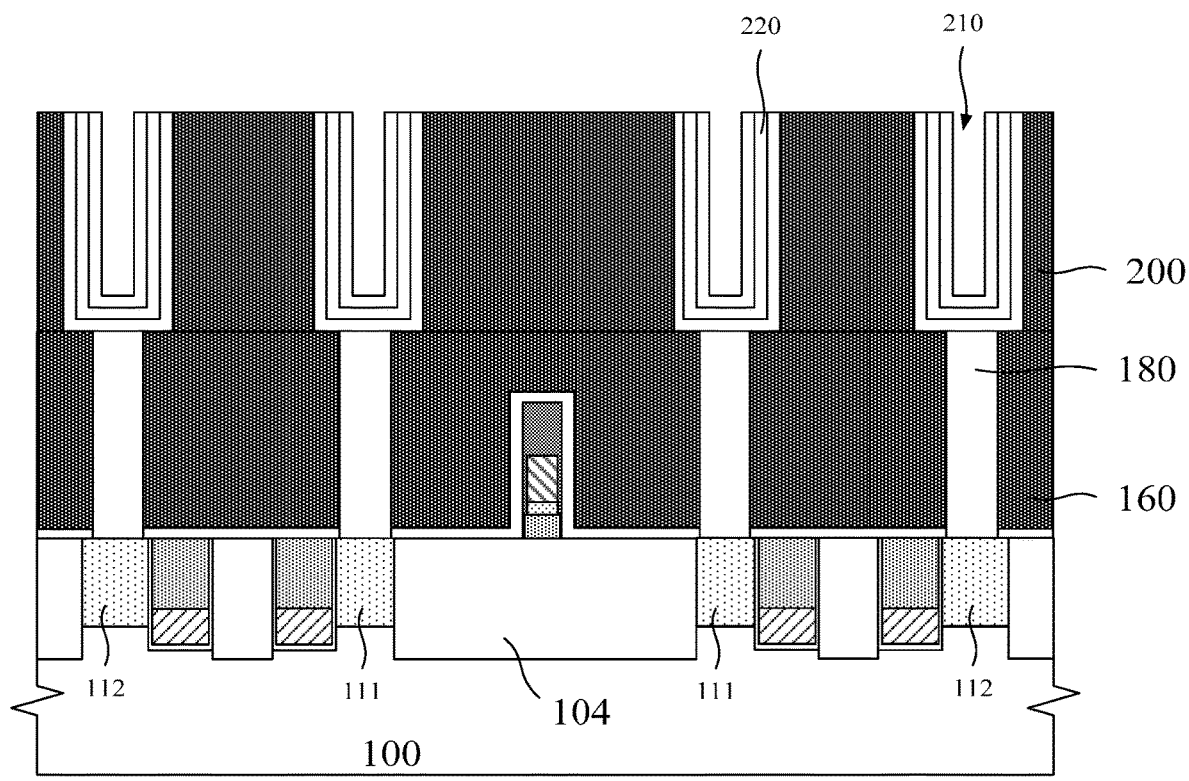
FIG. 15 is a schematic cross-sectional view taken along B-B' in FIG. 12 of a structure resulting from formation of capacitors in a method for fabricating a DRAM array according to some embodiments of the present disclosure.

Referring to FIG. 15, a schematic cross-sectional view taken along B-B' in FIG. 12 of a structure resulting from formation of capacitors in a method for fabricating a DRAM array is illustrated according to some embodiments of the present disclosure. As shown in FIG. 15, a plurality of capacitors 220 may be formed on a corresponding one of the plurality of contact terminals 180.

This step of forming the plurality of capacitors 220 may include: forming an epitaxial layer (not shown) on the contact terminals 180 for reducing resistance; and forming a second isolation layer 200 on the first isolation layer 160. In some embodiments, the second isolation layer 200 may be formed by successively depositing a silicon oxide layer, a silicon nitride layer, and an oxide layer with a thickness no smaller than 1 µm. The oxide layer is subsequently processed to form the capacitors 220, while the silicon nitride layer serves as a control layer defining openings 210 for the capacitors 220, each opening 210 penetrating through the second isolation layer 200. The capacitors 220 are then formed in the respective openings 210 in such a manner that they are electrically connected to the respective contact terminals 180. Each of the capacitors 220 may be composed of, for example, a dielectric layer sandwiched between two conductive layers. For example, for 60 nm or smaller DRAMs, the conductive layer in contact with the contact terminals 180 may be TiN, while the dielectric layer may be a dielectric material selected from the group comprising $ZrO2$, $Al_2O_3$ and $HfO2$. The outmost conductive layer may be composed of TiN and low-stress silicon-germanium (SiGe). However, the present disclosure is not so limited.

Among the active areas 111, 112 with different widths, the wider active areas 112 can lower contact resistance of the contact terminals 180 and hence their on-resistances. In addition, the capacitors 220 connecting to the wider active areas 112 can have greater capacities and higher storage levels, compared with those capacitors 220 connecting to the narrow active areas 111. For example, the capacitors 220 connecting with the narrower active areas 111 each assumes a level of "1" in a fully-charged state and a level of "0" in a depleted state; while each of those capacitors 220 connecting to the wider active areas 112 may assume a level of "2" in a fully-charged state, a level of "1" in a partially-charged state and a level of "0" in a depleted state. In this way, by combining the two types of capacitors 220, multiple levels of storage capacities may be obtained. For example, the two types of capacitors 220 connecting to the active areas 111, 112 may provide multiple levels of storage in combination, e.g., six levels including (2, 1), (2, 0), (1, 1), (1, 0), (0, 1) and (0, 0).

The method for fabricating a DRAM array discussed above is merely one of several possible options. Those skilled in the art may also use any other appropriate methods to make the DRAM array, based on the semiconductor layout structure for the DRAM array of the present disclosure. As long as the other appropriate methods improve pitches between word lines and hence increase device performance through the unique design of active areas, while allowing the same basic functionalities as normal devices, they do not depart from the spirit of the present disclosure.

In some embodiments, the DRAM array resulting from the above-described method of the present disclosure includes:

a semiconductor substrate 100;

an isolation structure 104 which defines, in the semiconductor substrate 100, a plurality of active areas 111, 112 extending along length-wise central axes L1, L2, the active areas 111, 112 arranged into an array and comprising a plurality of first active areas 111 and a plurality of second active areas 112, the plurality of first active areas 111 arranged along a first length-wise direction L1 of the active areas, the plurality of second active areas 112 arranged along a second length-wise direction L2 of the active areas, the plurality of first active areas 111 being parallel and adjacent to the plurality of second active areas 112, the first and second active areas 111, 112 alternately distributed in a direction of word-lines, the first active areas 111 having a first width smaller than a second width of the second active areas 112; and a plurality of bit lines 140 comprising first bit lines and second bit lines, formed on the active areas 111, 112 in the semiconductor substrate 100, wherein in a direction of word-lines, a projection of each of the first bit lines in the height-wise direction intersects corresponding ones of the first active areas 111, and a projection of each of the second bit lines in the height-wise direction intersects corresponding ones of the second active areas 112.

In some embodiments, the second width may be 20%-70% greater than the first width. In some embodiments, each of the active areas 111, 112 may have an elongated shape, wherein equally wide adjacent active areas 111, 112 in adjacent columns are collinearly arranged along a length-wise extension line of the active areas.

The DRAM array may further include a plurality of word lines 130 formed in the semiconductor substrate 100. In each column area 101, two word lines 130 intersect and traverse the first and second active areas 111, 112 respectively. The word lines 130 may contact gate structures formed on the active areas 111, 112. In some embodiments, the word lines 130 extend in the direction of each column area 101 where the active areas 111, 112 are alternately distributed. Accordingly, the gate structures on the active areas 111, 112 in each column area 101 are also connected to the same word line 130. In some embodiments, the word lines 130 may be buried word lines. That is, the word lines 130 may be formed within the semiconductor substrate 100.

The DRAM array may further include a plurality of contact terminals 180 formed on the active areas 111, 112 in the semiconductor substrate 100 and located on the opposing sides of the bit lines 140. In some embodiments, the DRAM array may further include a plurality of capacitors 220 each formed on one of the contact terminals 180.

In the DRAM array, the semiconductor layout structure and the fabrication method of the present disclosure, the active areas are arranged in such an array that adjacent active areas in each column have different widths and that the columns' direction intersects the direction in which the active areas extend. As a result, the difficulty of fabrication is reduced, and the issues of high turn-on voltage and high on-resistance can be effectively addressed in subsequent module fabrication process.

Further, capacitors formed on the basis of the above have different capacitances due to different charge storage capacities of the active areas with different widths. As a result, multiple levels of storage ability are achieved, thus improving device performance.

The description presented above on some preferred embodiments of the present disclosure does not limit the scope thereof in any sense. Any and all changes and modifications made by those of ordinary skill in the art based on the above teachings shall fall within the scope as the present disclosure, which is defined in the appended claims.

What is claimed is:

1. A semiconductor layout structure for a dynamic random access memory (DRAM) array, comprising an isolation structure and a plurality of active areas situated in a semiconductor substrate, each of the active areas extending along a length-wise central axis, wherein:

the isolation structure is situated among the plurality of active areas; and the active areas are arranged in an array and comprise a plurality of first active areas and a plurality of second active areas, the plurality of first active areas arranged along a first length-wise direction of the active areas, the plurality of second active areas arranged along a second length-wise direction of the active areas, the plurality of first active areas being parallel and adjacent to the plurality of second active areas, the first and second active areas alternately distributed in a direction of word-lines, the first active area having a first width smaller than a second width of the second active area.

2. The semiconductor layout structure of claim 1, wherein the second width is 20%-70% greater than the first width.

3. The semiconductor layout structure of claim 1, further comprising a plurality of word lines situated in the semiconductor substrate, wherein in each column of the active areas, two of the plurality of word lines intersect and traverse the first and second active areas respectively.

4. A dynamic random access memory (DRAM) array, comprising:
    a semiconductor substrate, in which an isolation structure defines a plurality of active areas each extending along a length-wise central axis, the active areas arranged in an array and comprising a plurality of first active areas and a plurality of second active areas, the plurality of first active areas arranged along a first length-wise direction of the active areas, the plurality of second active areas arranged along a second length-wise direction of the active areas, the plurality of first active areas being parallel and adjacent to the plurality of second active areas, the first and second active areas alternately distributed in a direction of word-lines, the first active area having a first width smaller than a second width of the second active area; and
    a plurality of bit lines comprising first bit lines and second bit lines, formed on the active areas of the semiconductor substrate, wherein in the direction of word-lines, a projection of each of the first bit lines in a height-wise direction intersects corresponding ones of the first active areas, and a projection of each of the second bit lines in the height-wise direction intersects corresponding ones of the second active areas.

5. The DRAM array of claim 4, wherein the second width is 20%-70% greater than the first width.

6. The DRAM array of claim 4, further comprising a plurality of word lines formed in the semiconductor substrate, wherein in the direction of word-lines, two of the plurality of word lines intersect and traverse the first and second active areas respectively.

7. The DRAM array of claim 4, further comprising a plurality of contact terminals formed on the active areas of the semiconductor substrate and distributed on opposing sides of the bit lines.

8. The DRAM array of claim 7, further comprising a plurality of capacitors each disposed on one of the contact terminals.

9. The DRAM array of claim 4, wherein adjacent active areas in adjacent columns are collinearly arranged along a length-wise direction of the active areas, wherein active areas that are collinearly arranged on a same line have a same width, while active areas that are arranged on adjacent lines have different widths, such that a projection of each of the bit lines in the height-wise direction goes through a center of a corresponding one of the active areas and the each bit line has a linear shape.

10. A method for fabrication a dynamic random access memory (DRAM) array, comprising:
    providing a semiconductor substrate;
    forming, in the semiconductor substrate, an isolation structure which defines a plurality of active areas extending along a length-wise central axis, the active areas arranged in an array and comprising a plurality of first active areas and a plurality of second active areas, the plurality of first active areas arranged along a first length-wise direction of the active areas, the plurality of second active areas arranged along a second length-wise direction of the second active areas, the plurality of first active areas being parallel and adjacent to the plurality of second active areas, the first and second active areas alternately distributed in a direction of word-lines, the first active area having a first width smaller than a second width of the second active area; and
    forming, on the active areas of the semiconductor substrate, a plurality of bit lines comprising first bit lines and second bit lines, wherein in the direction of word-lines, a projection of each of the first bit lines in a height-wise direction intersects corresponding ones of the first active areas, and a projection of each of the second bit lines in the height-wise direction intersects corresponding ones of the second active areas.

11. The method of claim 10, wherein forming the isolation structure that defines the plurality of active areas in the semiconductor substrate comprises:
    forming, on the semiconductor substrate, a first dielectric layer having a plurality of protrusions, wherein a projection of each of the protrusions of the first dielectric layer on the semiconductor substrate is rectangular.

12. The method of claim 11, wherein forming the isolation structure that defines the plurality of active areas in the semiconductor substrate comprises:
    forming a second dielectric layer on the first dielectric layer, wherein the second dielectric layer covers at least side walls of the protrusions along a profile of the protrusions of the first dielectric layer.

13. The method of claim 12, wherein forming the isolation structure that defines the plurality of active areas in the semiconductor substrate comprises:
    using an etchant to etch the second dielectric layer in a direction deviating from a height-wise direction of the protrusions and leaning toward one side of the protrusions so that the first dielectric layer is partially exposed, wherein opposing side walls of each of the protrusions are still covered by remaining portions of the second dielectric layer, and wherein the remaining portion of the second dielectric layer on one of the opposing side walls has a different width from that of the other remaining portion of the second dielectric layer on the other one of the opposing side walls.

14. The method of claim 13, wherein forming the isolation structure that defines the plurality of active areas in the semiconductor substrate comprises:
    forming isolation trenches in the semiconductor substrate by successively etching the first dielectric layer and the semiconductor substrate with the remaining portions of the second dielectric layer serving as an etching mask and by stopping the etching within the semiconductor substrate, wherein the isolation trenches define a plurality of active area mesas arranged in an array in the semiconductor substrate, each column of the active area mesas comprising first active area mesas having a first width and second active area mesas having a second width, the first active area mesas and the second active area mesas alternately distributed.

15. The method of claim 14, wherein forming the isolation structure that defines the plurality of active areas in the semiconductor substrate comprises:
    removing a remaining portion of the first dielectric layer and the remaining portions of the second dielectric layer.

16. The method of claim 15, wherein forming the isolation structure that defines the plurality of active areas in the semiconductor substrate comprises:
    forming the isolation structure by filling an isolation material in the isolation trenches in the semiconductor substrate; and
    forming the first active areas having the first width and the second active areas having the second width by doping the active area mesas.

17. The method of claim 11, wherein the second width is 20%-70% greater than the first width.

18. The method of claim 11, wherein the direction for etching is inclined at an angle of 10°-40° with respect to a normal of a top surface of the semiconductor substrate.

19. The method of claim 11, further comprising, subsequent to the formation of the plurality of bit lines:
   forming a plurality of contact terminals on the active areas in the semiconductor substrate, the plurality of contact terminals distributed on opposing sides of the bit lines.

20. The method of claim 19, further comprising, subsequent to the formation of the plurality of bit lines:
   forming a plurality of capacitors each located on one of the plurality of contact terminals.

* * * * *